United States Patent [19]
Berger et al.

[11] 4,337,403
[45] Jun. 29, 1982

[54] CHARGE-TRANSFER PHASE-INVERTER DEVICE AND DIFFERENTIAL AMPLIFIER COMPRISING SAID DEVICE

[75] Inventors: Jean L. Berger; Jean L. Coutures, both of Paris, France

[73] Assignee: Thomson-CSF, Paris, France

[21] Appl. No.: 158,863

[22] Filed: Jun. 12, 1980

[30] Foreign Application Priority Data

Jun. 12, 1979 [FR] France .............................. 79 14998

[51] Int. Cl.³ .................... G11C 19/28; H01L 29/78
[52] U.S. Cl. ................................. 307/221 D; 357/24
[58] Field of Search ................. 357/24 R; 307/221 D

[56] References Cited

U.S. PATENT DOCUMENTS

| 4,071,775 | 1/1978 | Hewes | 357/24 R |
| 4,099,197 | 7/1978 | Ibrahim et al. | 357/24 R |
| 4,210,825 | 7/1980 | Crochiere et al. | 307/221 D |
| 4,255,725 | 3/1981 | Berger et al. | 307/221 D |

Primary Examiner—Gene M. Munson
Attorney, Agent, or Firm—Roland Plottel

[57] ABSTRACT

The input voltage ($V_e$) of the device is constituted by the superposition of a direct voltage ($V_0$) and a time-varying sampled voltage ($v_e$). Subtraction means comprising storage and transfer electrodes, and diodes, establish the difference between the quantity of charges which is double the quantity corresponding to the direct voltage (that is, $2Q_{moy}$) and the quantity of charges corresponding to each sample of the variable voltage superposed on the direct voltage (that is, $Q_{moy} \pm q_e$).

8 Claims, 9 Drawing Figures

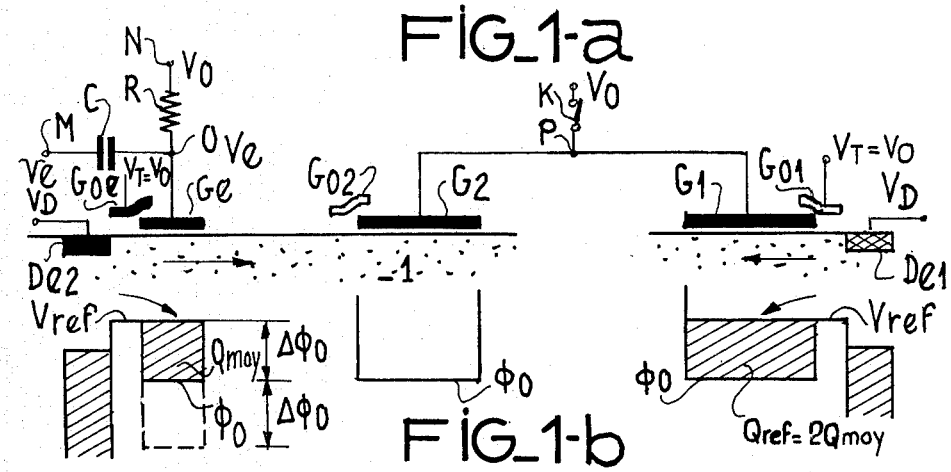
FIG_1-a
FIG_1-b
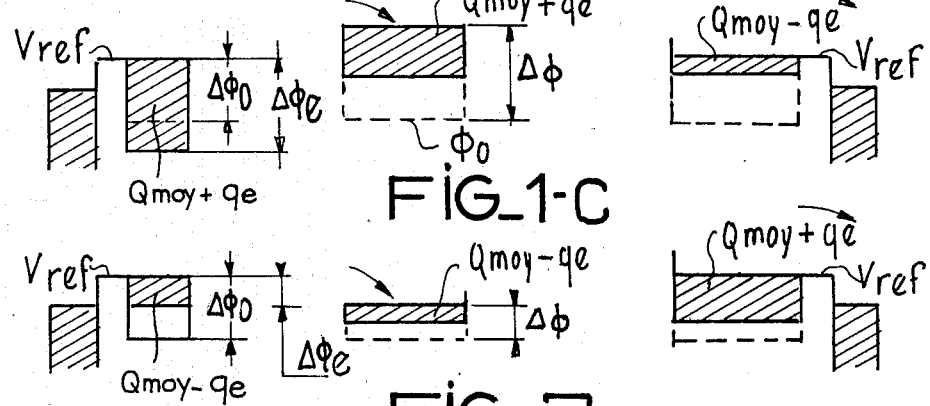
FIG_1-C
FIG_2
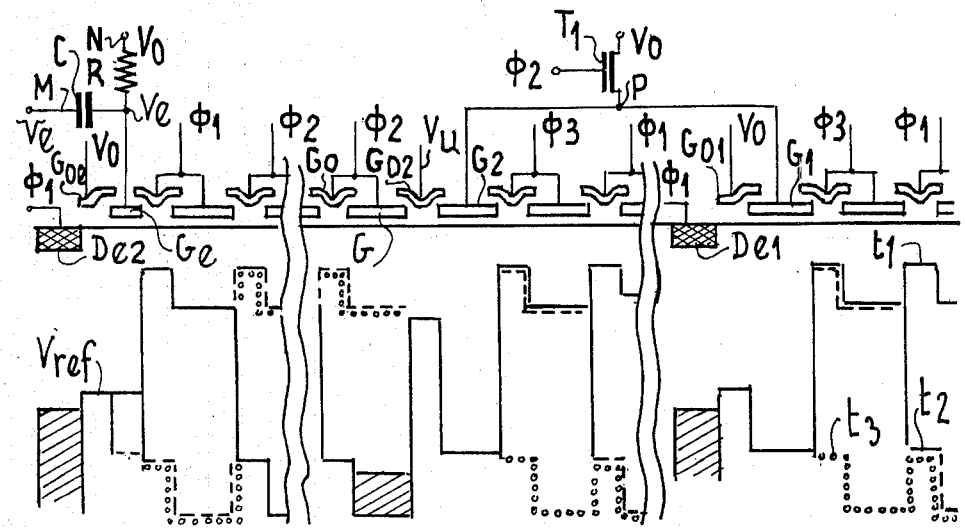

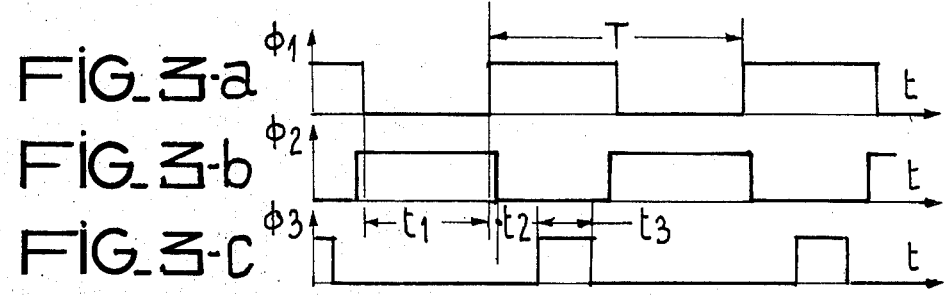
FIG_3-a
FIG_3-b
FIG_3-c
FIG_4
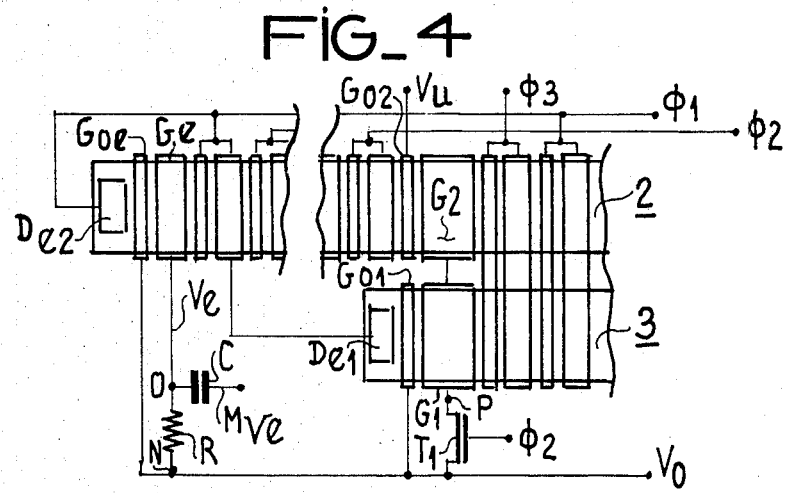
FIG_5
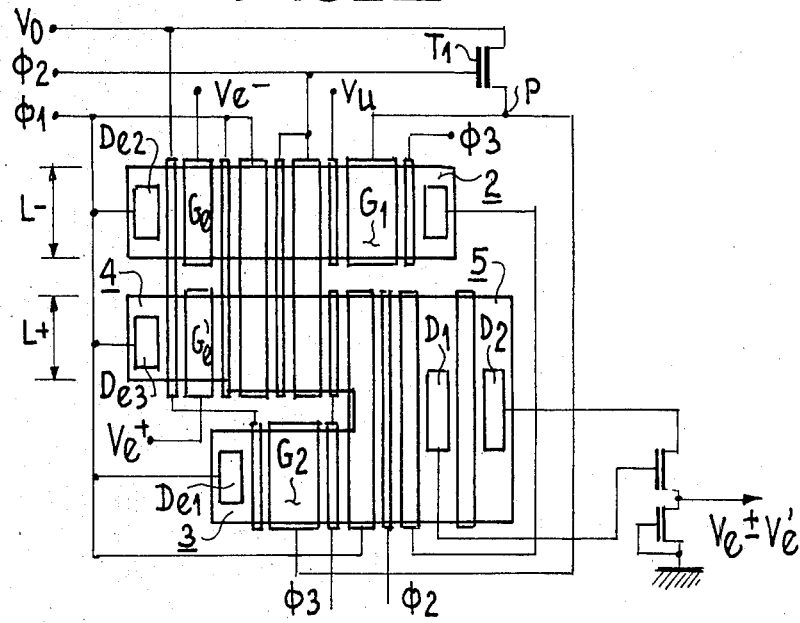

CHARGE-TRANSFER PHASE-INVERTER DEVICE AND DIFFERENTIAL AMPLIFIER COMPRISING SAID DEVICE

The present invention relates to a charge-transfer phase inverter device.

The invention also relates to a differential amplifier in which provision is made for a device of this type.

When processing analog signals by charge transfer, it is often necessary to produce signals in phase opposition. This is the case, for example, in the differential amplifiers employed in particular in the output stage of charge-transfer filters.

In the prior art, the signal to be inverted is usually converted to voltage, whereupon voltage phase-inversion is performed and the variations in voltage are re-injected as charges into the charge-transfer device.

Conversions of charges to voltage and conversely are subject to a disadvantage in that they have low linearity and provide a gain which is not readily reproducible. Furthermore, devices for performing such conversions and voltage phase-inversion are usually cumbersome and entail high power consumption.

The present invention relates to a device which performs phase inversion of a signal while remaining in the field of charges.

The advantage of this device lies in the fact that it can readily be integrated in a more complex charge-transfer device and makes it possible to obtain two signals in opposite phase with high precision. In a preferred embodiment, and in addition to the input direct voltage applied to a plurality of transfer and storage electrodes, said device makes it necessary to produce only three clock signals for performing the transfer of charges, thus increasing its simplicity and precision.

The device in accordance with the invention makes it possible in particular to provide a differential amplifier which does not entail any need for conversion of charges to voltage and therefore offers advantages from the power consumption and integration standpoint compared with differential amplifiers of the prior art.

The present invention relates to a charge-transfer phase-inverter device which receives an input voltage $V_e$ constituted by the superposition of a direct voltage $V_O$ and a time-varying sampled $v_e$. Said device comprises means for establishing the difference between the quantity of charges which is double the quantity corresponding to the direct voltage $V_O$ and the quantity of charges corresponding to each sample of the variable voltage $v_e$ superposed on the direct voltage. This accordingly results in the generation of charge packets corresponding to a voltage in phase opposition with respect to the input voltage $V_e$.

The input voltage $V_e$ is written: $V_e = V_O \pm v_e$. After injection into the device, the quantity of charges $Q_e$ corresponding to the voltage $V_e$ is written: $Q_e = Q_{moy} \pm q_e$. In accordance with the invention, means establish the difference between 2 $Q_{moy}$ and $Q_e$.

When $Q_e$ is greater than $Q_{moy}$ ($Q_e = Q_{moy} + q_e$), the result of this subtraction is written:

$$2Q_{moy} - (Q_{moy} + q_e) = Q_{moy} - q_e.$$

When $Q_e$ is smaller than $Q_{moy}$ ($Q_e = Q_{moy} - q_e$), the result of this subtraction is written:

$$2 Q_{moy} - (Q_{moy} - q_e) = Q_{moy} + q_e.$$

The device in accordance with the invention therefore makes it possible to obtain a quantity of charges $Q_{moy} - q_e$ from a quantity of charges $Q_{moy} + q_e$ and conversely. A phase inversion in the charges is therefore achieved.

One embodiment of the means employed for performing the subtraction in accordance with the invention is given by way of example in the following description.

Other objects, features and results of the invention will be more apparent upon consideration of the following description and accompanying drawings, wherein:

FIGS. 1a, 1b, 1c are respectively a transverse sectional view of one embodiment of the device according to the invention and diagrams illustrating the operation of said device;

FIG. 2 is a transverse sectional view showing the device of FIG. 1a which is inserted in a more complex charge-transfer device as well as a diagram which illustrates the charge transfer process;

FIGS. 3a, 3b, 3c are diagrams of signals which may be applied to the device shown in FIG. 2;

FIG. 4 is a top view of a device which is similar to the device of FIG. 2;

FIG. 5 is a top view of a differential amplifier in accordance with the invention.

In the different figures, the same references designate the same elements but the dimensions and proportions of the different elements have not been complied with for reasons of clarity.

FIG. 1a is a transverse sectional view of one embodiment of the device in accordance with the invention.

The device in accordance with the invention is formed on a semiconductor substrate 1 of p-type silicon, for example. Said substrate is covered with an insulating layer which is of silicon oxide in the example under consideration but is not shown in FIG. 1a. Provision is made on said insulating layer for an alternate arrangement of storage electrodes and charge-transfer electrodes which are placed substantially at right angles to the direction of propagation of the charges. The transfer electrodes are deposited on an overthickness of insulator which is not shown in FIG. 1a.

In accordance with known practice, this arrangement has a double function, namely on the one hand to ensure continuity of the potentials created within the semiconductor 1 and, on the other hand, to impose a single direction of transfer for the charge carriers.

This structure which is provided with an overthickness of insulator can be replaced by overdoping of the substrate, by ion implantation, which performs the same functions.

In FIG. 1a, there are shown only the transfer and storage electrodes constituting the phase-inverter device in accordance with the invention, with the exception of the transfer and storage electrodes whose sole function is the transfer of charges.

In the embodiment of the device according to the invention as shown in FIG. 1a, the means for performing subtraction comprise in particular a first storage electrode $G_1$ and a second storage electrode $G_2$. Said electrodes are connected electrically at a point P which can be connected to the direct voltage $V_O$ or can be allowed to remain "floating" or in other words to remain unconnected to any voltage source. In the figure, a switch K represents schematically the two possibilities of polarization of the point P.

Provision is made upstream of the first storage electrode in the direction of charge transfer indicated by an arrow for a transfer electrode $G_{O1}$ which is brought to a constant voltage $V_T$ and for a charge injection diode $D_{e1}$ which is connected to a variable voltage $V_D$.

The operation of a device constituted by the electrodes $G_1$, $G_2$, $G_{O1}$ and by the diode $D_{e1}$ is already known in the prior art.

In a first stage, the point P is connected to the constant voltage $V_O$. Prior to arrival of the charges beneath the storage electrode $G_2$, the variable voltage $V_D$ applied to the diode $D_{e1}$ is successively lower than, then higher than the surface potential $V_{ref}$ beneath the transfer electrode $G_{O1}$ which is connected to the constant voltage $V_T$. A reference quantity of charges $Q_{ref}$ is thus stored beneath the storage electrode $G_1$.

In a second stage, the point P is left in the floating condition. At the time of arrival of a quantity of charges $Q_e$ beneath the storage electrode $G_2$, the surface potential beneath the storage electrode $G_1$ is maintained constant at the value $V_{ref}$ by the transfer electrode $G_{O1}$ and the excess quantity of charges is passed beneath the injection diode $D_{e1}$. It is demonstrated that the quantity of charges located beneath the diode $D_{e1}$ at the end of said second stage is substantially equal to $Q_{ref}-Q_e$ (accordingly, the depletion capacitance beneath the storage electrode $G_2$ in comparison with the oxide capacitances of the storage electrodes $G_1$ and $G_2$ must be considered as negligible).

The phase-inverter device in accordance with the invention further comprises a third storage electrode $G_e$ located upstream of the second storage electrode $G_2$ in the direction of charge transfer indicated by an arrow. The input voltage $V_e$ is applied to said third storage electrode $G_e$ at a point O. A resistor R is connected between the point O and a point N; and a capacitor C is connected between the point O and a point M. The direct input voltage $V_O$ is applied to the point N and the time-varying sampled voltage $v_e$ is applied to the point M.

Provision is made upstream of the third storage electrode $G_e$ in the direction of charge transfer for a transfer electrode $G_{Oe}$ which is brought to the constant voltage $V_T$ as in the case of the transfer electrode $G_{O1}$ and for a charge injection diode $D_{e2}$ which is brought to the variable voltage $V_D$ as in the case of the charge injection diode $D_{e1}$.

It is recalled that the aim of the invention is to perform the subtraction between the quantity of charges which is double the quantity corresponding to the direct voltage $V_O$ and the quantity of charges corresponding to each sample of the variable voltage $v_e$ which is superposed on the direct voltage. The quantity of charges injected beneath the first storage electrode $G_1$ is therefore double the quantity corresponding to the direct voltage $V_O$ prior to arrival of a sample beneath the second storage electrode $G_2$ and when the point P is at the constant voltage $V_O$. The surface potential is then maintained constant beneath the first storage electrode $G_1$ at the time of arrival of a sample beneath the second storage electrode $G_2$ and whilst the point P is left in the floating condition.

FIGS. 1a, 1b and 1c are diagrams illustrating the operation of the device in accordance with the invention. These diagrams show the development of the surface potential $\phi_S$ within the substrate 1. The hatched zones indicate the presence of minority carriers.

FIG. 1a illustrates the injection of a quantity of charges $Q_{ref}$ beneath the electrode $G_1$ and of a quantity of charges $Q_e$ beneath the electrode $G_e$. The injection of charges beneath the electrodes $G_1$ and $G_e$ is performed in the same manner. The transfer electrodes $G_{O1}$ and $G_{Oe}$ are connected to the constant voltage $V_T$ which establishes the surface potential beneath the electrodes $G_1$ and $G_2$ at the maximum value $V_{ref}$. The voltage $V_D$ applied to the diodes $D_{e1}$ and $D_{e2}$ assumes successively a value which is lower than the surface potential $V_{ref}$ and then a value which is higher than this latter, thus effecting storage of the quantities of charges $Q_{ref}$ and $Q_e$ beneath the electrodes $G_1$ and $G_e$. This variation in voltage $V_D$ applied to the diodes takes place on the one hand when the point P is connected to the constant voltage $V_O$ and prior to arrival of a sample beneath the second storage electrode $G_2$ and, on the other hand, when a sample of the variable voltage $v_e$ is applied to the point M.

In accordance with the invention, the quantity of charges $Q_{ref}$ stored beneath the electrode $G_1$ must be equal to double the quantity of charges $Q_{moy}$ corresponding to the direct input voltage $V_O$.

The quantity of charges $Q_e$ injected beneath the electrode $G_e$ which receives the voltage $V_e = V_O \pm v_e$ is written: $Q_e = (V_O - V_a)C_e \pm v_e C_e = Q_{moy} \pm q_e$, where $V_a$ is a constant which depends on $V_{ref}$ and on physical characteristics which are the same for the entire charge-transfer device on which the inverter is formed and where $C_e$ represents the oxide capacitance of the electrode $G_e$.

The quantity of charges $Q_{moy}$ is therefore equal to $(V_O - V_a) C_e$.

Furthermore, the quantity of charges $Q_{ref}$ injected beneath the electrode $G_1$ which receives the voltage $V_O$ is written: $Q_{ref} = (V_O - V_a) C_1$, where $C_1$ represents the oxide capacitance of the electrode $G_1$.

When the point P receives a constant voltage equal to $V_O$, it is only necessary to choose a value of oxide capacitance $C_1$ double the value of $C_e$ in order that $Q_{ref}$ may be equal to $2 Q_{moy}$, which is the desired result.

In order to obtain an oxide capacitance $C_1$ having double the value of $C_e$, the storage electrode $G_1$ is usually given a surface area which is double that of the electrode $G_e$, which can be achieved with a satisfactory degree of accuracy.

The accuracy of the device in accordance with the invention is in fact dependent on the equality of the charges $2 Q_{moy}$ and $Q_{ref}$.

In order to reduce the number of biasing voltages of the device in accordance with the invention, the value which it is possible to choose for the constant voltage $V_T$ applied to the transfer electrodes $G_{O1}$ and $G_{Oe}$ is equal to the direct input voltage $V_O$.

After injection of the quantity of charges $Q_{ref} = 2 Q_{moy}$, the point P is allowed to remain in the floating condition. The surface potential beneath the first storage electrode $G_1$ is maintained constant at the value $V_{ref}$ by the transfer electrode $G_{O1}$ which is brought to the constant voltage $V_T$ (this voltage can be equal to $V_O$). The injection diode $D_{e1}$ is brought to a voltage which is higher than the surface potential $V_{ref}$. The quantity of charges $Q_e$ is transferred beneath the second storage electrode $G_2$. At the time of arrival of the quantity of charges $Q_e$ beneath the electrode $G_2$, an equivalent quantity of charges is subtracted from the quantity $Q_{ref}$ stored beneath the electrode $G_1$ and transferred to the diode $D_{e1}$. There therefore remains beneath the electrode $G_1$ the quantity of charges $Q_S$ such that:

$Q_S = 2Q_{moy} - Q_e$, which is in fact the objective to be accomplished.

FIG. 1a represents the surface potentials beneath the device in accordance with the invention in the case in which $V_T$ is equal to $V_O$ and in the case in which the surface area of the electrode $G_1$ is double that of the electrode $G_e$.

The input voltage $V_e$ can vary about $V_O$ between $V_a$ and $2V_O - V_a$. The surface potential beneath the electrode $G_e$ prior to injection of charges can therefore vary by the same quantity $\Delta\phi_O$ around the value $\phi_O$.

The variation $\Delta\phi$ in surface potential beneath the second storage electrode $G_2$ depends in the case of a given quantity of charges $Q_e$ on the relative values of the oxide capacitances $C_1$ and $C_2$ of the storage electrodes $G_1$ and $G_2$.

In a first approximation, the depth of the potential well $\Delta V_e$ beneath the electrode $G_e$ from the level $V_{ref}$ is written: $\Delta V_e \approx Q_e/C_e$.

Writing of the relations in charges at the point P and beneath the electrode $G_2$ after injection of the quantity of charges $Q_{ref}$ beneath the electrode $G_1$ and after injection of the quantity of charges $Q_e$ beneath the electrode $G_2$ makes it possible to obtain the following expression of $\Delta\phi$, in which the depletion capacitance beneath the electrode $G_2$ is neglected:

$$\Delta\phi \simeq Q_e \cdot \frac{C_1 + C_2}{C_1 \cdot C_2}.$$

The potential well created beneath the second storage electrode $G_2$ must be sufficient to permit storage of the maximum quantity of charges $Q_{max}$ injected beneath the electrode $G_e$ and corresponding to a well depth equal to $\phi_O + \Delta\phi_O$ beneath the electrode $G_e$ prior to injection of charges.

In order to minimize the variation $\Delta\phi$ in surface potential beneath the electrode $G_2$, the oxide capacitance, and therefore the surface area of the electrode $G_2$, are chosen so that: $C_2 \geqq C_1 = 2 C_e$.

FIGS. 1a, 1b and 1c represent the surface potentials within the substrate in the case in which: $C_1 = C_2 = 2 C_e$.

In this case and again in a first approximation, the variations $\Delta\phi$ in surface potential beneath the electrode $G_2$ are equal to the variations $\Delta\phi_e$ in surface potential beneath the electrode $G_e$.

FIG. 1b represents the surface potentials in the case in which the injected quantity $Q_e$ of charges is equal to: $Q_e = Q_{moy} + \frac{1}{2}Q_{moy}$.

FIG. 1c represents the surface potentials within the substrate in the case in which: $Q_e = Q_{moy} - \frac{1}{2}Q_{moy}$.

The sectional view of FIG. 2 shows the device of FIG. 1a inserted in a more complex charge-transfer device as well as a diagram illustrating the transfer of charges.

In FIG. 2, pairs of electrodes each consisting of a transfer electrode $G_O$ and a storage electrode $G$ for performing charge transfer are added to the device in accordance with the invention as shown in FIG. 1a between the gates $G_e$ and $G_2$, after the electrode $G_2$ and after the electrode $G_1$.

In the example shown in FIG. 2, the transfer electrode $G_{O2}$ which precedes the electrode $G_2$ is brought to a constant voltage $V_u$ which is lower than $V_O$ in order to increase the depth of the well beneath the electrode $G_2$.

FIGS. 3a, 3b and 3c are diagrams of signals which can be applied to the device shown in FIG. 2.

These clock signals $\phi_1$, $\phi_2$ and $\phi_3$ are periodic functions having the same period T and an amplitude which varies between a bottom level and a top level.

The signals $\phi_1$ and $\phi_2$ are practically in phase opposition but nevertheless have a slight overlap at the top level as is customary practice in the field of charge transfer. The signal $\phi_3$ passes to the top level whilst the signal $\phi_1$ is already present at this level, and returns to the bottom level before the signal $\phi_1$.

The signal $\phi_1$ is applied to the diodes $D_{e1}$ and $D_{e2}$ as well as to one transfer electrode-storage electrode pair out of two and in particular to the pair which follows the electrode $G_e$.

The signal $\phi_2$ is applied to the MOS transistor $T_1$ which is connected between the point P and the voltage $V_O$ and which replaces the switch K shown in FIG. 1a. The signal $\phi_2$ is also applied to one transfer electrode-storage electrode pair out of two, and in particular to the pair preceding the pair consisting of the transfer electrode $G_{O2}$ and the storage electrode $G_2$.

Finally, the signal $\phi_3$ is applied to the pair of electrodes which follows the storage electrodes $G_1$ and $G_2$.

At the instant $t_1$, the signal $\phi_2$ is at the top level and the signals $\phi_1$ and $\phi_3$ are at the bottom level. The surface potentials within the substrate are represented by a continuous line in FIG. 2. The direct voltage $V_O$ is fed to the electrodes $G_1$ and $G_2$ via the transistor $T_1$ which is triggered into conduction. The transition of the signal $\phi_1$ to the bottom level causes the diodes to inject quantities of charges $Q_{ref}$ and $Q_e$ beneath the electrodes $G_1$ and $G_e$. These quantities of charges are blocked beneath the electrodes $G_1$ and $G_e$ by the pairs of electrodes following $G_1$ and $G_e$ which are at the bottom level.

At the instant $t_2$, the signal $\phi_1$ is at the top level and the signals $\phi_2$ and $\phi_3$ are at the bottom level. The potentials within the substrate are shown in a dashed line in FIG. 2. The pair of electrodes preceding the pair consisting of transfer electrode $G_{O2}$ and storage electrode $G_2$ effects the transfer of the quantity of charges $Q_e$ beneath the electrode $G_2$ and thus causes the formation of the quantity of charges $Q_{moy} - Q_e$ corresponding to the phase-inverted signal beneath the electrode $G_1$.

At the instant $t_3$, the signals $\phi_1$ and $\phi_3$ are at the top level and the signal $\phi_2$ is at the bottom level. The surface potentials within the substrate are shown in dotted lines in FIG. 2. The pairs of electrodes which follow the electrodes $G_1$ and $G_2$ and are brought to the top level serve to remove the charges stored beneath the electrodes $G_1$ and $G_2$. The device in accordance with the invention is thus ready to receive at the following instant $t_1$ a further quantity of charges $Q_e$ corresponding to a further sample of the input voltage beneath the electrode $G_e$.

The accuracy of the device in accordance with the invention depends:
- on the accuracy with which the electrode $G_1$ can be fabricated so as to have a surface area which is double that of the electrode $G_e$;
- on the magnitude of the depletion capacitance beneath the electrode $G_2$ which is considered as negligible with respect to the oxide capacitances $C_1$ and $C_2$ of the electrodes $G_1$ and $G_2$;
- but above all on the magnitude of the stray capacitance at the point P which is primarily due to overlap of the transfer and storage electrodes and to the MOS transistor $T_1$ which is connected to the point P.

FIG. 4 is a top view showing a device which is similar to that of FIG. 2.

In the device shown in FIG. 4, the storage electrodes $G_e$ and $G_2$ on the one hand and the electrode $G_1$ on the other hand are formed in two parallel charge-transfer channels 2 and 3. The channel 2 delivers quantities of charges corresponding to the input voltage $V_e$ and the channel 3 delivers quantities of charges corresponding to the phase-inverted input voltage. From a practical construction standpoint, the device shown in FIG. 4 has the advantage of small overall size.

FIG. 5 is a top view of a differential amplifier in accordance with the invention.

The device shown in FIG. 5 comprises a phase-inverter device as described in the foregoing. The function of the device is to invert the phase of one of the two input voltages of the differential amplifier, this voltage being designated as $V_e^-$.

The differential amplifier in accordance with the invention comprises a plurality of parallel charge-transfer channels separated by isolating diffusions. The amplifier is provided in particular with channels 2 and 3 which are identical with those shown in FIG. 4. The channel 2 receives the input voltage $V_e^-$ to be inverted and transfers the charge $Q_e^-$ to be inverted. The channel 3 generates the inverted signal charge $-Q_e^-$ and transfers this latter. The differential amplifier in accordance with the invention further comprises a channel 4 which receives the second input voltage $V_e^+$ of the differential amplifier and transfers the charge $Q_e^+$. Finally, a channel 5 effects the junction of the channels 3 and 4 and the summation of the charges $Q_e^+$ and $-Q_e^-$. These charges are transferred to the channel 5 and read on floating diodes $D_1$ and $D_2$ which are connected to a follower stage in accordance with known practice.

The channel 4 comprises a charge-injection device which is identical with that of the channel 2. This device is constituted in particular by a charge-injection diode $D_{e3}$ and by a storage electrode $G_e'$ to which is applied the input voltage $V_e^+$ of the differential amplifier.

It has been noted earlier that the accuracy of the phase-inverter device in accordance with the invention depends especially on the stray capacitance $C_P$ existing at the point P at which the first and second storage electrodes $G_1$ and $G_2$ are connected.

As a result of the stray capacitance $C_P$, the quantity of charges removed from the electrode $G_2$ at the time of arrival of the charge $Q_e^-$ beneath the electrode $G_1$ is not equal to the charge $Q_e^-$ but to $\alpha\, Q_e^-$ which is defined as follows:

$$\alpha\, Q_e^- = \frac{C_2}{C_P + C_2} \cdot Q_e^- = Q_{initial} - Q_{final}.$$

The initial quantity of charges $Q_{initial}$ beneath the electrode $G_1$ is equal to $2\,Q_{moy}$. The quantity of charges $Q_{final}$ beneath $G_1$ is therefore expressed as follows:

$Q_{final} = 2Q_{moy} - \alpha Q_e^- = 2Q_{moy} - \alpha(Q_{moy} \pm q_e^-)$ $Q_{final} = (2-\alpha)Q_{moy} \mp \alpha q_e^-$ The final quantity of charges beneath the electrode $G_1$ is therefore constituted by a constant term $(2-\alpha)Q_{moy}$ and by a variable term $\mp \alpha q_e^-$. The error produced by the coefficient $\alpha$ in the variable term can be compensated by injecting the quantity of charges $Q^+$ into the channel 4 with an attenuation factor $\alpha$.

To this end, it is only necessary to ensure that the ratio of surface areas or of lengths when the widths are constant (which is usually the case) of the two storage electrodes $G_e'$ and $G_e$ to which the two input voltages $V_e^+$ and $V_e^-$ of the amplifier are applied is equal to:

$$\frac{\text{Surface area } G_e'}{\text{Surface area } G_e} = \frac{L'}{L} = \alpha.$$

In this case, the quantity of charges $Q_e^+$ injected into the channel 4 is in fact written:

$Q_e^+ = \alpha Q_{moy} \pm \alpha q_e^+.$

The resultant charge within the channel 5 which performs summation of the charges transferred into the channels 3 and 4 becomes:

$(\alpha Q_{moy} \pm \alpha q_e^+) + [(2-\alpha)Q_{moy} \mp \alpha q_e^-] = 2Q_{moy} \pm \alpha(q_e^+ - q_e^-)$ The differential amplifier in accordance with the invention therefore has a common-mode rejection, the efficiency of which depends only on the degree of accuracy with which the stray capacitance $C_P$ and therefore the coefficient $\alpha$ can be determined.

What is claimed is:

1. A charge-transfer phase-inverter device which receives an input voltage ($V_e$) constituted by the superposition of a direct voltage ($V_O$) and a time-varying sampled voltage ($v_e$), wherein said device comprises means for performing the subtraction between the quantity of charges which is double the quantity corresponding to the direct voltage ($2Q_{moy}$) and the quantity of charges corresponding to each sample of the variable voltage superposed on the direct voltage ($Q_{moy} \pm q_e$).

2. A device according to claim 1, wherein the means for performing the subtraction are formed on a semiconductor substrate (1) covered with an insulating layer on which is placed an alternate arrangement of transfer electrodes and charge-storage electrodes, and comprise:
   a first and a second storage electrode ($G_1$, $G_2$) electrically connected at a point P;
   a third storage electrode ($G_e$) which is located upstream of the second storage electrode in the direction of charge transfer and to which the input voltage ($V_e$) is applied;
   first means for performing the injection beneath the first storage electrode of a quantity of charges which is double the quantity corresponding to the direct voltage ($2Q_{moy}$) prior to arrival of a sample beneath the second storage electrode and whilst the point P is at the direct voltage $V_O$;
   second means for maintaining a constant surface potential ($V_{ref}$) beneath the first storage electrode at the time of arrival of a sample beneath the second storage electrode and whilst the point P is left in the floating condition.

3. A device according to claim 2, wherein the first means are constituted by a transfer electrode ($G_{O1}$, $G_{O2}$) brought to a constant voltage $V_T$ and by a charge-injection diode ($D_{e1}$, $D_{e2}$) which are located upstream of the first and third storage electrodes ($G_1$, $G_e$) in the direction of charge transfer, each injection diode being successively brought to a voltage which is lower and then higher than the surface potential ($V_{ref}$) beneath the transfer electrode connected to $V_T$ and, wherein the surface area of the first storage electrode is double the surface area of the third storage electrode.

4. A device according to claim 3, wherein the second means are constituted by the transfer electrode ($G_{O1}$) brought to the constant voltage $V_T$ and by the charge-injection diode ($D_{e1}$) which are located upstream of the first transfer electrode ($G_1$) in the direction of charge transfer, the injection diode being brought to a voltage which is higher than the surface potential ($V_{ref}$) beneath the transfer electrode which is connected to said constant voltage $V_T$.

5. A device according to claim 4, wherein the constant voltage $V_T$ is equal to the direct input voltage ($V_O$).

6. A device according to claim 5, wherein the surface area of the second storage electrode ($G_2$) is greater than or equal to the surface area of the first storage electrode ($G_1$).

7. A differential amplifier, wherein said amplifier comprises a device according to claim 6 which inverts the phase of one of the two input voltages ($V_e^+$, $V_e^-$) of the amplifier.

8. A differential amplifier according to claim 7, wherein the ratio of surface areas of the two storage electrodes ($G_e'$, $G_e$) to which the input voltage $V_e^+$ and the input voltage to be inverted $V_e^-$ of the amplifier are applied is equal to the ratio of the oxide capacitance ($C_1$) of the first storage electrode ($G_1$) of the inverter device to the sum of said capacitance and of the stray capacitance ($C_P$) at the point P of said inverter device.

* * * * *